INVENTORS
Teruaki Matsuura
Kyo Kinoshita
BY
Marn & Jangarathis
ATTORNEYS

INVENTORS
Teruaki Matsuura
Kyo Kinoshita
BY
Marn & Jangarathis
ATTORNEYS 3,531,731
United States Patent Office
Patented Sept. 29, 1970

3,531,731
VARIABLE RESISTANCE CIRCUIT MEANS

Teruaki Matsuura and Kyo Kinoshita, Tokyo, Japan, assignors to Nippon Electric Company, Limited, Tokyo, Japan Filed Feb. 25, 1969, Ser. No. 801,940
Claims priority, application Japan, Feb. 29, 1968, 43/12,572
Int. Cl. H03g 3/50
U.S. Cl. 330—28 7 Claims

ABSTRACT OF THE DISCLOSURE

Variable resistance circuit means particularly adapted for direct coupling to transistor amplifier means is provided in accordance with the teachings of the present invention. The variable resistance circuit means provided by the present invention includes a plurality of transistor means whose collector electrodes are commonly connected to a first junction point and whose emitter electrodes are commonly connected to a common emitter resistor. In addition, at least one of said transistor means is connected in a grounded-base configuration while the remainder of said plurality of transistor means have their base electrodes connected to ground through an impedance means which is larger than the base-emitter impedance of said transistor means. A reference D.C. potential is adapted to be applied to the base electrode of at least one of said plurality of transistor means while the base electrode potentials of the other of said plurality of transistor means are controlled. The value of the A.C. resistance manifested by said variable resistance circuit means between said junction point and the commonly connected emitter electrodes or said junction point and ground is thereby controlled while the value of the D.C. voltage and the D.C. current therebetween is maintained at a constant.

This invention relates to variable resistance circuit means and more particularly to variable resistance circuit means adapted for direct coupling to transistor amplifier means.

In conventional variable resistance circuit means, such as those which employ diodes, the A.C. resistance value of the diode is controlled by the bias current flowing therethrough. However, when such conventional variable resistance circuit means are coupled in the D.C. sense to transistor amplifier means for the purposes of forming gain controlled amplifier means, the gain controlled amplifier means formed thereby will exhibit amplitude and phase characteristics which vary with variations in the gain thereof. This condition obtains in the thus formed gain controlled amplifier means because the biased state of said gain controlled amplifier means will change with variations in the gain and such changes in the bias will manifest themselves as variations in the amplitude and phase characteristics. Furthermore, this phenomenon becomes more pronounced when the gain controlled amplifier means thus formed is of the multi-stage, directly coupled type. Therefore, as such variations in the bias condition of gain controlled amplifier means renders it difficult to control the gain at high signal levels, the use of directly coupled variable resistance circuit means to form such gain controlled amplifier means has not proved advantageous.

In order to alleviate the foregoing difficulties involved with the direct coupling of conventional variable resistance circuit means to transistor amplifier means, current design practices have adopted the technique of coupling conventional variable resistance circuit means to such transistor amplifier means through a coupling capacitor and a choke coil. However, although this mode of coupling improves the overall performance of the gain controlled amplifier means formed, the large physical size of the capacitor required for coupling is incompatible with the miniaturized nature of present-day transistor amplifier means as well as the installation space normally alloted therefor, and the sub-resonance of the choke coil tends to curtail optimum performance in the high frequency ranges of operation. Accordingly, it will be seen that presently available variable resistance circuit means do not readily admit of direct coupling in the D.C. sense to transistor amplifier means where a D.C. voltage or current which is varying is capable of effecting said variable resistance circuit means while, if a coupling therebetween is established through a coupling capacitor and choke coil, the resultant gain controlled amplifier means formed is not structurally compact or physically reduced in size and the high frequency operation thereof is substantially impaired.

Therefore, it is a principal object of this invention to provide variable resistance circuit means which is particularly adapted for direct coupling to transistor amplifier means. Other objects and advantages of the present invention will become clear from the following detailed description of several embodiments thereof, and the novel features will be particularly pointed out in conjunction with the appended claims.

In accordance with this invention, variable resistance circuit means is provided wherein a plurality of transistor means having commonly connected collector electrodes are connected so that each emitter electrode thereof is connected to a common emitter resistor and, if necessary, a common bypass capacitor, at least one of said transistor means is connected in a grounded-base configuration while the other of said transistor means have their base electrodes connected to ground through an impedance means larger than the base-emitter impedance of said transistor means, and a reference D.C. potential is adapted to be applied to the base electrode of at least one of said transistor means while the base electrode potentials of the other transistor means are controlled, whereby the value of A.C. resistance between the coupled collector electrodes and ground, or between the coupled collector electrodes and the coupled emitter electrodes is controlled and the D.C. voltage and current therebetween is maintained constant. The invention will be more clearly understood by reference to the following detailed description of several embodiments thereof in conjunction with the accompanying drawings, in which:

Figure 1:
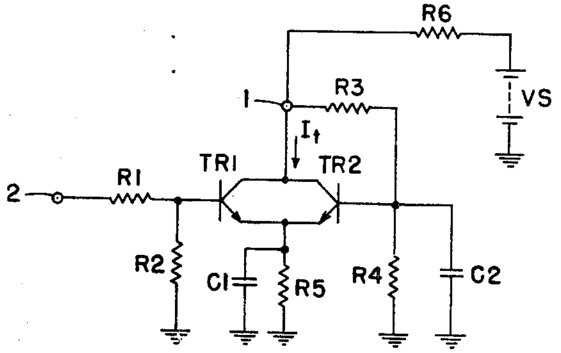
FIG. 1 is a schematic diagram illustrating an embodiment of the variable resistance circuit means according to this invention.

Referring now to the drawings and more particularly to FIG. 1 thereof, there is shown a schematic diagram illustrating one embodiment of the variable resistance circuit means according to the present invention. As shown in FIG. 1, this embodiment of the variable resistance circuit means comprises first and second transistor means TR1 and TR2, biasing resistor means R1 through R5, D.C. power supply means VS, and an equivalent resistor means R6 which represents the D.C. impedance of transistor amplifier means or other active circuit means that are directly coupled to the variable resistance circuit means according to the present invention. The first and second transistor means TR1 and TR2 shown in FIG. 1 have been illustrated as NPN devices; however, as will be obvious to those of ordinary skill in the art, PNP devices may be utilized if the polarity relationships indicated in FIG. 1 are appropriately reversed in the well-known manner. The collector electrodes of the first and second transistor means TR1 and TR2 are each commonly connected to junction point 1 while the emitter electrodes thereof each commonly connect to ground through the biasing resistor means R5. In addition, as illustrated in FIG. 1, whenever the illustrated variable resistance circuit means is to be controlled in a manner to manifest small values of impedance, an emitter bypass capacitor means C1 may be connected in a shunting relationship across the biasing resistor means R5 so as to provide an A.C. path to ground. The junction point 1, to which each of the collector electrodes of the first and second transistor means TR1 and TR2 are connected, also connects to the D.C. power supply means VS through the equivalent resistor means R6 which represents the D.C. resistance developed by the transistor amplifier means or other active devices directly coupled to the variable resistance circuit means according to the present invention. The first and second transistor means TR1 and TR2, thus connected, take the form of a differential amplifier in the D.C. sense wherein the distribution ratio of the collector currents of said first and second transistor means TR1 and TR2 will vary depending on the relationship of the potential applied to the base electrode of each transistor means.

The base electrode of the transistor TR2 is connected to the junction point 1 through the biasing resistor means R3 and is additionally connected to ground through the biasing resistor means R4 which is connected in parallel with the bypass capacitor means C2. Accordingly, the potential applied to the base electrode of the second transistor means TR2, in the D.C. sense, will be determined by the voltage divider formed by the biasing resistors R3 and R4 connected between the junction point 1, the base electrode of transistor means TR2, and ground in the manner shown while the base electrode of transistor TR2 is grounded for A.C. through the bypass capacitor means C2. Although the voltage divider utilized to provide a bias, in the D.C. sense, for the base electrode of the transistor means TR2 has been illustrated as comprising biasing resistor means R3 and R4, as will be apparent to those of ordinary skill in the art, Zener diode means may be substituted for the biasing resistor means R4. This substitution is sometimes advantageous as, under these conditions, the bypass capacitor means C2 may often be eliminated because even though the dynamic resistance of such Zener diode means will vary according to the Zener voltage, its value is generally in the range of tens of ohms so that the base electrode of the transistor means TR2 will be essentially at ground potential for A.C. signals. In addition, an emitter follower circuit may be substituted for the voltage divider formed by the biasing resistor means R3 and R4 in which case the emitter electrode of the emitter follower transistor means would be connected to the base electrode of transistor means TR2. The substitution of the emitter follower circuit has the advantage, in certain embodiments of the present invention, that the output impedance thereof is low and impedance matching may readily be accomplished therewith. Therefore, it will be seen that the transistor means TR2 is essentially connected in a grounded-base or common-base configuration in the illustrated embodiment of the variable resistance circuit means according to the present invention.

The base electrode of the transistor means TR1 is connected to control terminal means 2 through the biasing resistor means R1 and maintained above ground potential by the biasing resistor means R2. The first transistor means TR1 is thus connected in a grounded-emitter or common-emitter configuration and the control terminal means 2 is adapted to receive control signals to thereby control the A.C. resistance of the embodiment of the variable resistance circuit means illustrated in FIG. 1 in a manner described hereinafter. Therefore, in this embodiment of the variable resistance circuit means according to the present invention, as shall be seen below, the output A.C. resistance exhibited between the junction point 1 and ground or between the junction point 1 and the commonly connected emitter electrodes of transistors TR1 and TR2 may be changed in accordance with the control signal applied to the control terminal means 2.

In the operation of the embodiment of the variable resistance circuit means illustrated in FIG. 1, since the transistor means TR1 and TR2 form a differential amplifier in the D.C. sense as aforesaid, the distribution ratio of the collector current $I_{c1}$ of transistor means TR1 to the collector current $I_{c2}$ of the transistor means TR2 will vary depending upon the relationship between the reference voltage, as determined by the voltage divider formed by the biasing resistors R3 and R4, applied to the base electrode of the transistor means TR2 and the control signal in the form of a voltage applied to the control terminal means 2. However, although the individual collector currents $I_{c1}$ and $I_{c2}$ of the transistor means TR1 and TR2 will vary, the sum of the collector currents $I_{c1}$ and $I_{c2}$ is constant as is the D.C. voltage between the junction point 1, to which each of the collector electrodes of the transistor means TR1 and TR2 is connected, and ground and the junction point 1 and the commonly connected emitter electrodes of TR1 and TR2. Therefore, in the illustrated embodiment of the variable resistance circuit means according to the present invention, the D.C. voltages and currents which exist between the commonly connected collector electrodes and ground, and between the commonly connected collector electrodes and the commonly connected emitter electrodes are maintained constant.

In addition, as will be appreciated by those of ordinary skill in the art, since the output impedance of a grounded-base or common-base transistor configuraiton is generally in excess of several kilo-ohms regardless of the magnitude of the collector voltage and the collector current, so long as saturation is avoided; the output impedance of the transistor means TR2 connected in this configuration due to the bypass capacitor means C2 will be maintained in this range. However, in a grounded-emitter or common-emitter transistor configuration, if the external impedance $Z_b$ as seen from the base electrode of the transistor means is sufficiently in excess of its base to emitter impedance, the output resistance or the collector to emitter resistance manifested by this transistor configuration can be controlled by the collector current in a manner which is substantially independent of the external impedance $Z_b$ seen from the base. In the case of the FIG. 1 embodiment, the transistor means TR1 is connected in a grounded-emitter or common-emitter transistor configuration as mentioned above and a value of $Z_b$ equal to or greater than 1KΩ will be a sufficient value for $Z_b$ when an ordinary transistor is employed for transistor means TR1. Therefore, in this embodiment of the variable resistance circuit means according to the present invention, the output A.C. resistance as measured between the commonly connected collector electrodes and emitter electrodes of transistors TR1 and TR2 or between the commonly connected collector electrodes and ground may be changed by controlling the potential of the control signal applied to control terminal 2 without causing any change in the sum of the collector currents $I_{c1}$ and $I_{c2}$ as measured at the junction point 1.

In the embodiment of this invention illustrated in FIG. 1, the transistor means TR2 has been shown grounded at its base electrode in the A.C. sense by the bypass capacitor C2; however, it should be clearly understood that either of the transistor means TR1 or TR2 may be thus grounded without any deviation from the teachings of the instant invention. Furthermore, as will be obvious to those of ordinary skill in the art, when the illustrated embodiment of the variable resistance circuit is to be controlled so that a relatively small value of output resistance is manifested thereby, the emitter bypass capacitor C1 illustrated in FIG. 1 is desirable because the emitter current of the second transistor means TR2 is maintained at a very low value while the emitter-base impedance of the transistor TR2, the impedance which is connected in series with the emitter electrode of the first transistor, may reach a value which is substantial.

As will be seen from the foregoing explanation of the embodiment of the present invention illustrated in FIG. 1, the A.C. resistance of the depicted embodiment of the variable resistance circuit means as measured between the commonly connected collector electrodes of transistor means TR1 and TR2 and the commonly connected emitter electrodes thereof or ground may be controlled by the potential of the control signal applied to control terminal 2 under conditions wherein the D.C. voltages and currents which exist between the commonly connected collector electrodes at junction point 1 and ground and between the commonly connected collector electrodes and the commonly connected emitter electrodes are maintained constant. Furthermore, although two transistor means TR1 and TR2 were illustrated in the FIG. 1 embodiment of the variable resistance circuit means according to the present invention, it should be manifest that additional transistor means may be utilized therein and that the use of such additional transistor means may prove highly advantageous when it is desired that the variable resistance circuit means be controllable down to very low values of A.C. resistance or be used in conjunction with multi-stage amplifier means. Therefore, if it is assumed that a third transistor means TR3 is to be incorporated into the embodiment of the variable resistance circuit means illustrated in FIG. 1, the collector electrode of said third transistor means TR3 would be connected in common with the collector electrodes of the first and second transistor means TR1 and TR2, the emitter electrode of said third transistor means TR3 would be connected in common with the emitter electrodes of the first and second transistor means TR1 and TR2, and the base electrode of the third transistor means TR3 may be connected in common with either one of the base electrodes of the first or second transistor means TR1 or TR2 or, alternatively, said base electrode of the third transistor means TR3 may be independently controlled. However, if the base electrode of such third transistor means TR3 is to be connected in common with either the base electrode of the first or second transistor means TR1 or TR2, respectively, it is preferable that said base electrode of the transistor means TR3 be connected in common with the base electrode thereof which is grounded in the A.C. sense through a low impedance. This connection, which in the case of the FIG. 1 embodiment would be to the base electrode of the second transistor means TR2, is preferable because it is virtually impossible to derive a large input impedance, as viewed from the base electrode, for the third transistor means TR3 as would be required for the operation thereof in a grounded-emitter or common-emitter configuration. Accordingly, it will be seen that variable resistance circuit means according to the present invention enables the A.C. resistance exhibited between a pair of terminals to be controlled while the D.C. voltage and the D.C. current existing between such two terminals is maintained at a constant. Therefore, the variable resistance circuit means according to the instant invention is particularly desirable when used in conjunction with multistage directly coupled amplifier means.

Figure 2:
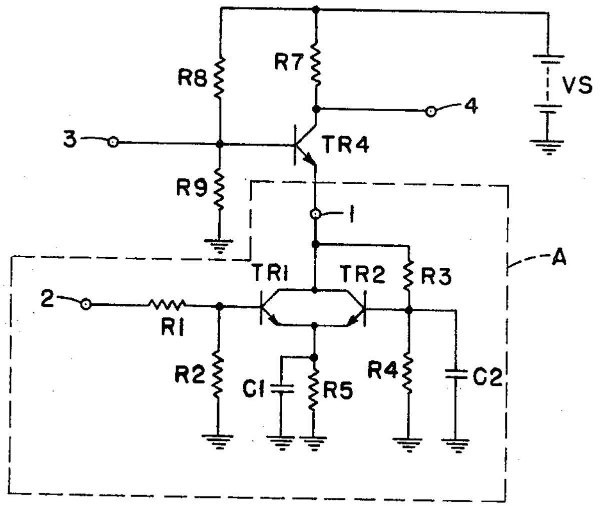
FIGS. 2 and 3 are schematic diagrams of amplifier circuits utilizing embodiments of the variable resistance circuit means according to the present invention.

FIG. 2 is a schematic diagram of an amplifier circuit which illustrates a first application of an embodiment of the variable resistance circuit means according to the present invention. As shown in FIG. 2, the illustrated amplifier circuit comprises an embodiment of the variable resistance circuit means according to the present invention, as indicated by the dashed block A, transistor means TR4 connected in an amplifying configuration, biasing resistor means R7–R9 and D.C. power supply means VS. The embodiment of the variable resistance circuit means indicated by the dashed block A may take precisely the same form and operate in the same manner as that previously described in conjunction with FIG. 1. Accordingly, the structural content and mode of operation of the embodiment of the variable resistance circuit means enclosed within the dashed block A will not be here further described; however, where necessary for explicit explanatory matter, appropriate reference will be made to the description given in conjunction with FIG. 1. The junction point 1 of the embodiment of the variable resistance circuit means indicated by the dashed block A is connected in the manner indicated to the emitter electrode of the transistor means TR4. The transistor means TR4 has been illustrated in a common-emitter amplifying configuration wherein an input terminal means 3 is connected to the base electrode thereof, an output terminal means 4 is connected to the collector electrode thereof and suitable D.C. potential is applied to each of the electrodes thereof from the D.C. power supply means VS through the biasing resistor means R7–R9. Therefore, as the D.C. power supply means VS and the embodiment of the invention enclosed within the dashed block A were present in species in FIG. 1, it will be seen that the transistor means TR4 and the requisite biasing resistor means R7–R9 therefor were represented in FIG. 1 by the equivalent resistor means R6.

In the operation of the gain controlled amplifier circuit illustrated in FIG. 2, when a signal to be amplified is present at the input terminal means 3 and a control signal in the form of a potential level is applied to the control terminal means 2 to thereby control the A.C. resistance exhibited between the junction point 1 and ground or the junction point 1 and the coupled emitter electrodes of transistor means TR1 and TR2, the A.C. resistance exhibited by the embodiment of this invention indicated by the block A will be controlled and the amount of feedback present in the illustrated amplifier circuit is changed. In accordance therewith, the gain of the depicted amplifier circuit as measured between the output terminal means 4 and the input terminal means 3 will be appropriately changed. Therefore, as the bias for transistor means TR4 in this exemplary embodiment will not vary when the gain is thus controlled, the gain of the amplifier circuit utilizing an embodiment of the variable resistance circuit means according to the present invention, as shown in FIG. 2, may be controlled to a higher signal level and, in addition thereto, the design of the illustrated gain control amplifier circuit may be easily determined.

Figures 3, 4:
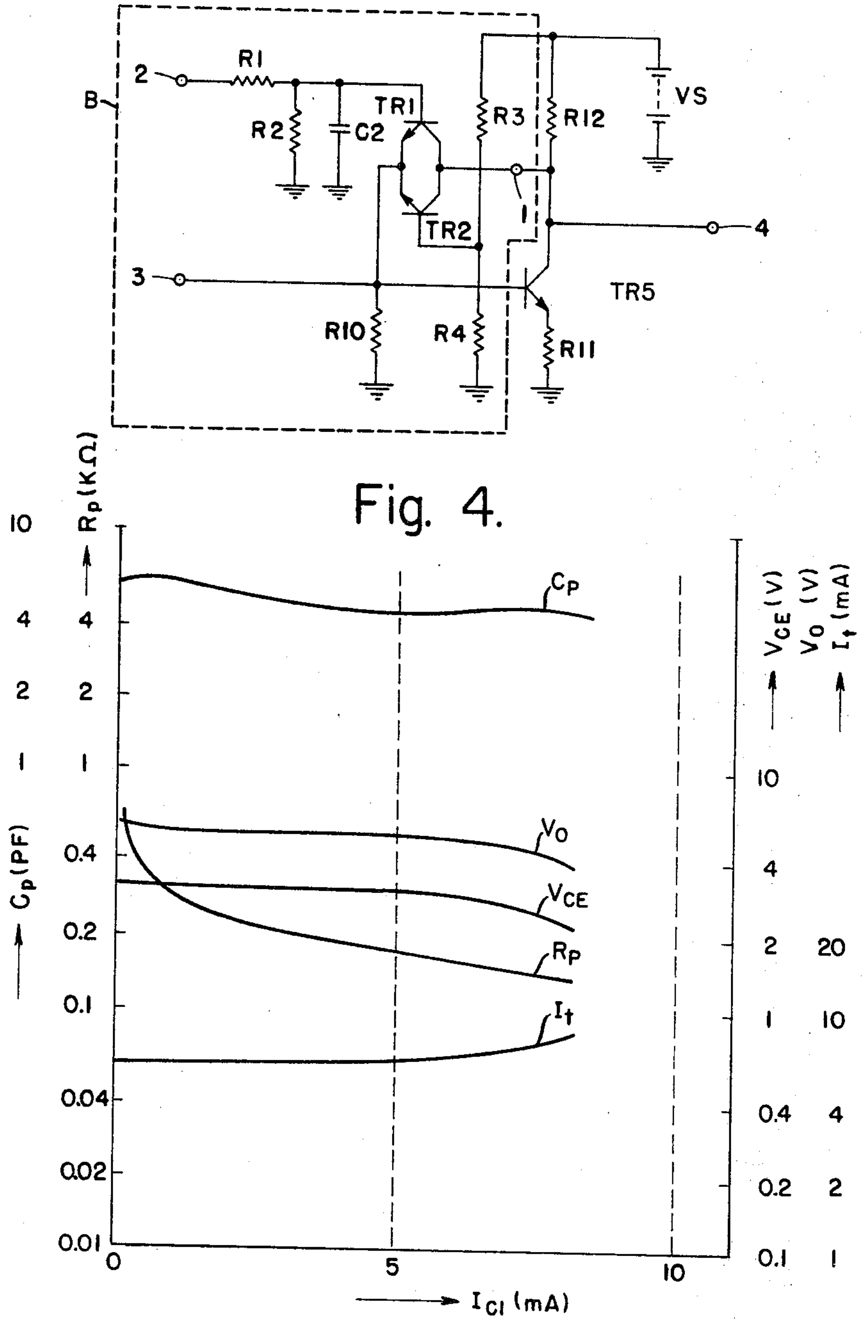
FIG. 4 is a graphical illustration showing various characteristics of an embodiment of the variable resistance circuit means according to the present invention.

FIG. 3 is a schematic diagram of an amplifier circuit which illustrates a second application of an embodiment of the variable resistance circuit means according to the present invention. As shown in FIG. 3, the illustrated amplifier circuit comprises an embodiment of the variable resistance circuit means according to the present invention, as indicated by the dashed block B, transistor means TR5 connected in an amplifying configuration, biasing resistor means R10 through R12 and D.C. power supply means VS. The embodiment of the variable resistance circuit means indicated by the dashed block B is similar in structural form and function to the embodiment of this invention illustrated in FIG. 1; however, the variable resistance circuit means here relied upon differs from that illustrated in FIG. 1 in that the first transistor means TR1 has its base electrode coupled to ground via the bypass capacitor means C2, the base electrode of the second transistor means TR2 has not been provided with an A.C. bypass to ground, and the commonly connected emitter electrodes of the first and second transistor means TR1 and TR2 are coupled to ground without a bypass capacitor means through the biasing resistor R10 which also serves to bias the input to the transistor means TR5. However, as it was previously specified in regard to the FIG. 1 embodiment of this invention that either of the first or second transistor means TR1 or TR2 may be provided with an A.C. path to ground through a bypass capacitor and hence take the form of grounded-base or common-base transistor configuration so long as the other transistor means is in a common-emitter configuration, and further that the provision of an A.C. bypass to ground for the commonly connected emitter electrodes of the first and second transistor menas TR1 and TR2 is not always necessary, it will be seen that the overall operation of the embodiment of the variable resistance circuit means indicated by the dashed block B is substantially the same as was described in conjunction with the FIG. 1 embodiment of this invention. Therefore, it will be manifest that when control signals in the form of a potential are applied to the control terminal means 2 of the variable resistance circuit means indicated by the dashed block B, the A.C. resistance exhibited thereby between the junction point 1 thereof and ground or the coupled emitter electrodes of the first and second transistor means TR1 and TR2, will be controlled in substantially the same manner as was described above. The junction point 1 of the embodiment of the variable resistance circuit means indicated by the dashed block B is connected in the manner illustrated to the collector electrode of the transistor means TR5 and the biasing resistor means R12 therefor. In addition, the commonly connected emitter electrodes of the first and second transistor means TR1 and TR2 are coupled to the base electrode of the transistor means TR5. Accordingly, as the embodiment of the variable resistance circuit means indicated by the dashed block B is connected between the base and collector electrodes of the transistor means TR5, a collector-base feedback loop is formed thereby in the well-known manner. The transistor means TR5 has been illustrated in a common-emitter amplifying configuration wherein an input terminal means 3 is connected to the base electrode thereof, an output terminal means 4 is connected to the collector electrode thereof and suitable D.C. potential is applied to each of the electrodes thereof, as well as the embodiment of the variable resistance circuit means indicated by the dashed block B, from the D.C. power supply means VS through the biasing resistor means R10 through R12.

In the operation of the amplifier circuit illustrated in FIG. 1, it will be seen that the variable A.C. resistance exhibited by the embodiment of the variable resistance circuit means connected in the collector-base feedback loop of the transistor means TR5 acts in the well-known manner to control the amount of feedback. Therefore, the variable resistance of said embodiment of the variable resistance circuit means indicated by the dashed block B acts pursuant to the control signals applied to the control terminal means 2 thereof to appropriately change the feedback of the illustrated amplifier circuit and hence control the gain thereof.

FIG. 4 is a graphical illustration showing the various characteristics of an embodiment of the variable resistance circuit means according to the present invention. The circuit utilized to obtain the requisite values for the curves plotted in FIG. 4 was similar to the embodiment of this invention illustrated in FIG. 1. The various circuit parameters relied upon in the circuit utilized were as follows:

| | |
|---|---|
| TR1, TR2 | transistor 2SC251. |
| R1 | 9.1KΩ. |
| R2, R4 | 4.7KΩ. |
| R3 | 2.87KΩ. |
| R5 | 470Ω. |
| R6 | 2KΩ. |
| C1, C2 | 4000 pf. |
| VS | 20 v. |

And the frequency relied upon for the measurements was 70 mHz.

The annotations utilized on the curve plotted in FIG. 4 indicate the following:

$R_p$—A.C. resistance (parallel component from which the value corresponding to the parallel effect of R6 is subtracted), $C_p$—Static capacity (parallel component), $V_o$—D.C. voltage between terminal 1 and the ground, $V_{CE}$—D.C. voltage between collector and emitter of TR1 (and TR2), and $I_t$—D.C. current flowing into terminal 1.

As may be appreciated from an inspection of the characteristic curves plotted in FIG. 4, the D.C. current $I_t$ flowing into junction point 1 and the D.C. voltage $V_o$ which resides between junction point 1 and ground will remain substantially constant while the A.C. resistance value exhibited by the embodiment of this invention under test may be varied from approximately 700Ω to 140Ω. Furthermore, if the absolute values of the biasing resistor means R3 and R4 are selected to be large, the parallel effects due to these resistors are reduced whereby the upper limit of the variable resistance value manifested by the variable resistance circuit means according to this invention can be extended above the value plotted for this exemplary embodiment. Therefore, it will be seen that the characteristics of the embodiment of the variable resistance circuit means according to the present invention allow the A.C. resistance exhibited by this embodiment of the invention to be controlled over a wide range while the D.C. voltage and current are maintained substantially constant. Therefore, the variable resistance circuit means according to the present invention is particularly well suited for direct coupling to transistor amplifier means.

Accordingly, it will be seen that variable resistance circuit means has been provided in accordance with the teachings of the present invention wherein the A.C. resistance exhibited by a pair of terminals may be controlled while the D.C. voltage and D.C. current residing between such terminals is maintained at a constant.

While the invention has been described in connection with several exemplary embodiments thereof, it will be understood that many modifications will be readily apparent to those of ordinary skill in the art; and that this application is intended to cover any adaptations or variations thereof. Therefore, it is manifestly intended that this invention be only limited by the claims and the equivalents thereof.

What is claimed is:

1. Variable resistance circuit means comprising:

a plurality of transistor means, each of said plurality of transistor means including base, collector and emitter electrodes, said plurality of transistor means having their collector electrodes connected in common and their emitter electrodes connected in common;

resistor means connected to said commonly connected emitter electrodes;

means for connecting at least one of said plurality of transistor means in a grounded-base configuration;

means for connecting said base electrodes of the remainder of said plurality of transistor means to ground through external impedance means having a value, as seen from said base electrodes of the remainder of said transistors, which exceeds the base-emitter impedance of each of said plurality of transistor means;

means for applying a first reference potential to the remainder of said plurality of transistor means at said base electrode thereof;

means adapted to apply a second reference potential to at least a select one of said plurality of transistor means at said base electrode thereof; and means for controlling the potential of the base electrodes of the remaining ones of said plurality of transistor means, said variable resistance circuit means thereby exhibiting a controlled A.C. resistance measured between said commonly connected collector electrodes and said commonly connected emitter electrodes and a controlled A.C. resistance as measured between said commonly connected collector electrodes and ground while D.C. voltage and current present between said commonly connected emitter electrodes and said commonly connected collector electrodes are maintained substantially constant.

2. The variable resistance circuit means according to claim 1 wherein said means adapted to apply a second reference potential to at least a select one of said plurality of transistor means at said base electrode thereof includes means interconnecting said base electrode of said at least a select one of said plurality of transistor means to said commonly connected collector electrodes.

3. The variable resistance circuit means according to claim 2 wherein said means for connecting at least one of said plurality of transistor means in a grounded-base configuration includes means for interposing a low impedance A.C. path between the base electrode of said at least one of said plurality of transistor means and ground.

4. The variable resistance circuit means according to claim 3 wherein said means for interconnecting said base electrode of said at least a select one of said plurality of tarnsistor means to said commonly connected collector electrodes includes voltage divider means.

5. The variable resistance circuit means according to claim 4 wherein said means for interposing a low impedance A.C. path includes bypass capacitor means.

6. The variable resistance circuit means according to claim 1 wherein said resistor means connected to said commonly connected emitter electrodes for interposing a low impedance A.C. path includes bypass capacitor in parallel to the resistor means connected to said commonly connected emitter electrodes.

7. The variable resistance circuit means according to claim 1 additionally comprising amplifying transistor means and connector means for connecting said commonly connected collector electrodes and said commonly connected emitter electrodes in a feedback path of said amplifying transistor means.

References Cited

UNITED STATES PATENTS

| | | | |
|---|---|---|---|
| 2,372,243 | 3/1945 | Wulfsberg | 330—145 |
| 2,859,288 | 11/1958 | Tobias et al. | 330—145 X |
| 3,254,308 | 5/1966 | McLean et al. | 330—29 X |
| 3,446,987 | 5/1969 | Ito | 330—145 X |

ROY LAKE, Primary Examiner

J. B. MULLINS, Assistant Examiner

U.S. Cl. X.R.

307—237; 330—29, 86, 145